(12) United States Patent
Sasaki et al.

(10) Patent No.: US 10,304,666 B2
(45) Date of Patent: May 28, 2019

(54) PLASMA PROCESSING APPARATUS HAVING A BAFFLE PLATE AND A RECTIFYING PLATE

(71) Applicant: TOKYO ELECTRON LIMITED, Tokyo (JP)

(72) Inventors: Ryo Sasaki, Miyagi (JP); Yusei Kuwabara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 339 days.

(21) Appl. No.: 15/212,400

(22) Filed: Jul. 18, 2016

(65) Prior Publication Data

US 2017/0025256 A1 Jan. 26, 2017

(30) Foreign Application Priority Data

Jul. 22, 2015 (JP) .................. 2015-145124

(51) Int. Cl.
*H01J 37/32* (2006.01)
*C23C 16/50* (2006.01)
*C23C 16/455* (2006.01)

(52) U.S. Cl.
CPC ...... *H01J 37/32633* (2013.01); *C23C 16/455* (2013.01); *C23C 16/50* (2013.01);
(Continued)

(58) Field of Classification Search
CPC ... C23C 16/44; C23C 16/4412; C23C 16/448; C23C 16/455; C23C 16/50; H01J 37/32;
(Continued)

(56) References Cited

U.S. PATENT DOCUMENTS

| 7,648,578 B1 * | 1/2010 | Itatani ................ C23C 16/4412 118/715 |
| 2003/0094135 A1 * | 5/2003 | Komiya ............. C23C 16/4412 118/715 |

(Continued)

FOREIGN PATENT DOCUMENTS

| JP | 5-4466 U | 1/1993 |
| JP | 2004-31447 A | 1/2004 |
| JP | 2012-15451 A | 1/2012 |

*Primary Examiner* — Kenneth A Bratland, Jr.
(74) *Attorney, Agent, or Firm* — Rothwell, Figg, Ernst & Manbeck, P.C.

(57) ABSTRACT

A plasma processing apparatus includes: a chamber; a placing table; an exhaust path provided around the placing table to surround the placing table, and configured to exhaust a gas within a processing space above the semiconductor wafer placed on the placing table; an exhaust device configured to exhaust the gas within the processing space through the exhaust path; a baffle plate having a plurality of through holes and provided between the processing space and the exhaust path to surround the placing table; and a rectifying plate provided around the placing table to surround the placing table within the exhaust path at a position farther from the processing space than the baffle plate, and forming an opening within the exhaust path to make a sectional area of a flow path within the exhaust path larger at a position farther from a position within the exhaust path connected to the exhaust device.

20 Claims, 7 Drawing Sheets

(52) U.S. Cl.
CPC .. *H01J 37/32009* (2013.01); *H01J 37/32082* (2013.01); *H01J 37/32715* (2013.01); *H01J 37/32834* (2013.01)

(58) Field of Classification Search
CPC ........... H01J 37/32009; H01J 37/32082; H01J 37/32623; H01J 37/32633; H01J 37/32642; H01J 37/32715; H01J 37/32834
USPC .............. 117/84, 105, 200, 204; 156/345.29, 156/345.33, 345.34, 345.35, 345.51; 118/715, 722, 723 R, 723 MW, 723 E
See application file for complete search history.

(56) References Cited

U.S. PATENT DOCUMENTS

| | | | |
|---|---|---|---|
| 2005/0103440 A1* | 5/2005 | Sato | H01J 37/32623 156/345.29 |
| 2010/0081284 A1 | 4/2010 | Balakrishna et al. | |

\* cited by examiner

US 10,304,666 B2

PLASMA PROCESSING APPARATUS HAVING A BAFFLE PLATE AND A RECTIFYING PLATE

CROSS-REFERENCE TO RELATED APPLICATIONS

This application is based on and claims priority from Japanese Patent Application No. 2015-145124, filed on Jul. 22, 2015, with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

In a plasma processing apparatus, a substrate to be processed ("substrate") is carried into a chamber, and a predetermined processing gas is supplied into the chamber. Then, plasma of the processing gas is generated within the chamber. A predetermined processing such as, for example, etching or film forming is performed on the substrate by the generated plasma of the processing gas. In the plasma processing, for example, a pressure within the chamber or a flow velocity of the processing gas supplied into the chamber is one of important factors that influence the properties of the processed substrate. Also, when a deviation occurs in a distribution of a pressure within the chamber or a flow velocity of the processing gas, non-uniformity of a property such as, for example, a critical dimension (CD) is increased within the plane of the substrate. Therefore, it is desirable that the distribution of the pressure within the chamber or the flow velocity of the processing gas is uniform within the plane of the substrate.

Since the supply of the processing gas may be performed above the center of the substrate, the processing gas may be substantially uniformly supplied over the entire circumference of the substrate. However, in the exhaust of the processing gas, it is difficult to dispose an exhaust device below the center of the substrate due to the structure of a plasma processing apparatus. Thus, the exhaust device is provided at a position spaced away from the top of the central axis of the substrate. Thus, in the circumferential direction of the substrate, a distance to the exhaust device is varied, and an exhaust amount of the processing gas on the substrate is varied depending on the distance to the exhaust device. This causes a deviation in a distribution of a pressure or a flow velocity of the processing gas on the substrate.

In order to avoid this, it is considered, in a baffle plate provided between a processing space in which plasma is generated and an exhaust path that exhausts the processing gas and having a plurality of through holes, to decrease an opening area of a through hole closer to the exhaust device and increase an opening area of a through hole farther from the exhaust device. Accordingly, in the circumferential direction of the substrate, an exhaust conductance becomes lower at a position closer to the exhaust device, and becomes higher at a position farther from the exhaust device. Accordingly, the exhaust amount of the processing gas on the substrate becomes more uniform in the circumferential direction of the substrate, thereby suppressing the deviation in the distribution of a pressure or a flow velocity of the processing gas on the substrate. See, e.g., Japanese Utility Model Laid-Open Publication No. 5-4466.

SUMMARY

The present disclosure provides a plasma processing apparatus including: a chamber that is air-tightly configured such that a predetermined processing is performed on a substrate to be processed ("substrate") carried into the chamber by plasma generated within the chamber; a placing table provided within the chamber and configured to place the substrate thereon; an exhaust path provided around the placing table to surround the placing table, and configured to exhaust a gas within a processing space above the substrate placed on the placing table; an exhaust device connected to the exhaust path and configured to exhaust the gas within the processing space through the exhaust path; a baffle plate having a plurality of through holes and provided between the processing space and the exhaust path to surround the placing table; and a rectifying plate provided around the placing table to surround the placing table within the exhaust path at a position farther from the processing space than the baffle plate. The rectifying plate foil is an opening within the exhaust path around the placing table to make a sectional area of a flow path within the exhaust path larger at a position farther from a position within the exhaust path connected to the exhaust device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
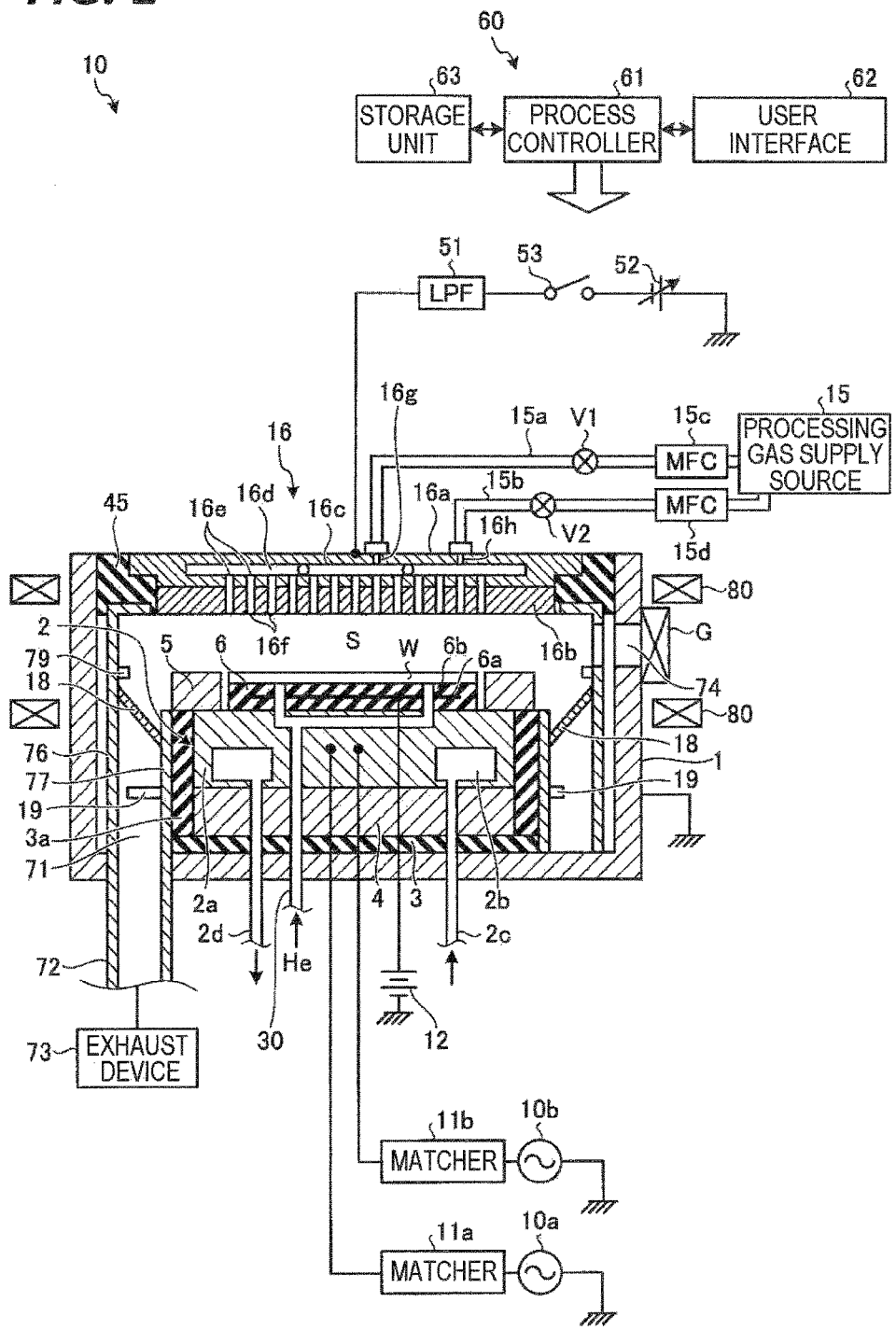
FIG. 1 is a sectional view illustrating an example of a plasma processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Since the number of through holes provided in a baffle plate or the opening area of each of the through holes has an influence on the environment within a chamber such as, for example, a pressure within the chamber or a flow velocity of the processing gas, the number of the through holes provided in the baffle plate or the opening area of each of the through holes is optimized in accordance with the processing condition. Therefore, in a case where a baffle plate having through holes of which opening areas are varied depending on a distance from the exhaust device is used, whenever a processing condition is changed, the baffle plate is exchanged with a baffle plate corresponding to the changed processing condition. Thus, when a plurality of processings having different processing conditions are continuously performed on one substrate to be processed ("substrate"), a time becomes longer until the plurality of processings are completed.

According to an aspect of the present disclosure, a plasma processing apparatus includes: a chamber that is air-tightly configured such that a predetermined processing is performed on a substrate to be processed ("substrate") carried into the chamber by plasma generated within the chamber; a placing table provided within the chamber and configured to place the substrate thereon; an exhaust path provided around the placing table to surround the placing table, and configured to exhaust a gas within a processing space above the substrate placed on the placing table; an exhaust device connected to the exhaust path and configured to exhaust the gas within the processing space through the exhaust path; a baffle plate having a plurality of through holes and provided between the processing space and the exhaust path to surround the placing table; and a rectifying plate provided around the placing table to surround the placing table within the exhaust path at a position farther from the processing space than the baffle plate. The rectifying plate forms an opening within the exhaust path around the placing table to make a sectional area of a flow path within the exhaust path larger at a position farther from a position within the exhaust path connected to the exhaust device.

According to an exemplary embodiment of the plasma processing apparatus, the rectifying plate is provided on an inner wall of the exhaust path closer to the placing table between inner walls of the exhaust path provided around the placing table, and the opening is formed by a gap between an outer peripheral surface of the rectifying plate and an inner wall of the exhaust path farther from the placing table.

According to an exemplary embodiment of the plasma processing apparatus, the rectifying plate has an annular shape when viewed from a top side, an inner peripheral surface of the rectifying plate is in contact with the inner wall of the exhaust path, and a center of the outer peripheral surface is located closer to the exhaust device than a center of a placing surface of the placing table on which the substrate is placed.

According to an exemplary embodiment of the plasma processing apparatus, the rectifying plate is provided on an inner wall of the exhaust path farther from the placing table between inner walls of the exhaust path provided around the placing table, and the opening is formed by a gap between an inner peripheral surface of the rectifying plate and an inner wall of the exhaust path closer to the placing table According to an exemplary embodiment of the plasma processing apparatus, the rectifying plate has an annular shape when viewed from a top side, an outer peripheral surface of the rectifying plate is in contact with the inner wall of the exhaust path, and a center of the inner peripheral surface is located farther from the exhaust device than a center of a placing surface of the placing table on which the substrate is placed.

According to an exemplary embodiment of the plasma processing apparatus, the baffle plate is provided at a position lower than a placing surface of the placing table on which the substrate is placed.

According to an exemplary embodiment of the plasma processing apparatus, a distance between the baffle plate and the rectifying plate is longer than a thickness of the rectifying plate.

According to an exemplary embodiment of the plasma processing apparatus, the baffle plate is provided obliquely around the placing table so that a position of the baffle plate becomes higher as getting farther from the placing table.

According to an exemplary embodiment of the plasma processing apparatus, the plurality of through holes are provided within a plane of the baffle plate at substantially equal intervals.

According to an exemplary embodiment of the plasma processing apparatus, the rectifying plate forms the opening as a single opening within the exhaust path.

According to various aspects and exemplary embodiments of the present disclosure, under any optional processing condition, the deviation in the pressure and flow velocity of the processing gas in the circumferential direction of the substrate may be suppressed.

Hereinafter, exemplary embodiments of the plasma processing apparatus disclosed herein will be described in detail with reference to the drawings. Also, the disclosure is not limited by the present exemplary embodiments. In addition, respective exemplary embodiments to be described below may be appropriately combined within a range that does not contradict the processing contents.

Exemplary Embodiment 1

[Plasma Processing Apparatus 10]

FIG. 1 is a sectional view illustrating an example of a plasma processing apparatus 10. For example, as illustrated in FIG. 1, the plasma processing apparatus 10 includes an air-tightly configured chamber 1. The chamber 1 is formed of, for example, aluminum with an anodized surface in a substantially cylindrical shape, and grounded. Within the chamber 1, a placing table 2 is provided to horizontally support a semiconductor wafer W which is an example of a substrate.

The placing table 2 includes a base 2*a* and an electrostatic chuck 6. The base 2*a* is made of a conductive metal such as, for example, aluminum. The placing table 2 also functions as a lower electrode. The base 2*a* is supported by a support table 4 made of a conductor. The support table 4 is supported at the bottom portion of the chamber 1 through an insulating plate 3. A focus ring 5 made of, for example, single-crystal silicon, is provided at the outer periphery of the top surface of the placing table 2. A cylindrical inner wall member 3*a* made of, for example, quartz, is provided to surround the periphery of the placing table 2 and the support table 4.

The electrostatic chuck 6 is provided on the top surface of the base 2*a*. The electrostatic chuck 6 includes insulators 6*b*, and an electrode 6*a* provided between the insulators 6*b*. The electrode 6*a* is connected to a DC power supply 12. The electrostatic chuck 6 generates a coulomb force on the surface of the electrostatic chuck 6 by a DC voltage applied from the DC power supply 12, thereby attracting and holding the semiconductor wafer W on the top surface of the electrostatic chuck 6. The placing table 2 attracts and holds the semiconductor wafer W on the top surface of the electrostatic chuck 6, thereby placing the semiconductor wafer W thereon. The top surface of the electrostatic chuck 6 corresponds to a placing surface of the placing table 2.

A flow path 2b through which a coolant flows is formed within the base 2a. A coolant such as, for example, Galden is circulated in the flow path 2b through flow paths 2c and 2d of the placing table 2. By the coolant circulating through the inside of the flow path 2b, the placing table 2 and the support table 4 are controlled at a predetermined temperature. A pipe 30 configured to supply a heat transfer gas (a backside gas) such as, for example, helium gas to the rear surface side of the semiconductor wafer W is provided in the placing table 2 to extend through the placing table 2. The pipe 30 is connected to a backside gas supply source (not illustrated). By the coolant flowing within the flow path 2b, and the heat transfer gas supplied to the rear surface side of the semiconductor wafer W, the semiconductor wafer W attracted to and held on the top surface of the electrostatic chuck 6 may be controlled at a predetermined temperature.

Above the placing table 2, a shower head 16 is provided to face the placing table 2 substantially in parallel, that is, to face the semiconductor wafer W placed on the placing table 2. The shower head 16 also functions as an upper electrode. That is, the shower head 16 and the placing table 2 function as a pair of electrodes (the upper and lower electrodes). A gap between the semiconductor wafer W placed on the placing table 2 and the shower head 16 is referred to as a processing space S. A high-frequency power source 10a is connected to the base 2a of the placing table 2 through a matcher 11a. A high-frequency power source 10b is connected to the base 2a of the placing table 2 through a matcher 11b.

The high-frequency power source 10a supplies a high frequency power having a predetermined frequency (e.g., 100 MHz) which is used for generating plasma, to the base 2a of the placing table 2. The high-frequency power source 10b supplies a high frequency power having a frequency (e.g., 13 MHz) lower than that of the high-frequency power source 10a, as a high frequency power having a predetermined frequency which is used for drawing (biasing) ions, to the base 2a of the placing table 2.

The shower head 16 is provided at the top of the chamber 1. The shower head 16 includes a body portion 16a and a top plate 16b. The shower head 16 is supported at the top of the chamber 1 through an insulating member 45. The body portion 16a is made of, for example, aluminum with an anodized surface, and detachably supports the top plate 16b at the bottom side thereof. The top plate 16b is made of a silicon-containing material such as, for example, quartz.

Inside the body portion 16a, gas diffusion chambers 16c and 16d are provided. On the bottom portion of the body portion 16a, a plurality of gas flow holes 16e are formed to be positioned below the gas diffusion chamber 16c or 16d. The gas diffusion chamber 16c is provided at substantially the center of the shower head 16, and the gas diffusion chamber 16d is provided around the gas diffusion chamber 16c to surround the gas diffusion chamber 16c. Each of the gas diffusion chambers 16c and 16d is capable of independently controlling, for example, a flow rate of a processing gas.

In the top plate 16b, gas flow holes 16f are provided to extend through the top plate 16b in the thickness direction, and are communicated with the above described gas flow holes 16e, respectively. With this configuration, the processing gas supplied to the gas diffusion chambers 16c and 16d is supplied into the chamber 1 through the gas flow holes 16e or 16f to be diffused in a shower form. For example, in the body portion 16a, a temperature control mechanism such as, for example, a heater (not illustrated) or a pipe (not illustrated) for circulating a coolant is provided so as to control the shower head 16 at a temperature within a desired range during the processing of the semiconductor wafer W.

The body portion 16a of the shower head 16 is provided with a gas introducing port 16g configured to introduce a processing gas to the gas diffusion chamber 16c, and a gas introducing port 16h configured to introduce a processing gas to the gas diffusion chamber 16d. One end of a pipe 15a is connected to the gas introducing port 16g. The other end of the pipe 15a is connected to a processing gas supply source 15 configured to supply a processing gas used for processing the semiconductor wafer W through a valve V1 and a mass flow controller (MFC) 15c. One end of a pipe 15b is connected to the gas introducing port 16h. The other end of the pipe 15b is connected to the processing gas supply source 15 through a valve V2 and a MFC 15d. The processing gas supplied from the processing gas supply source 15 is supplied to each of the gas diffusion chambers 16c and 16d through the pipes 15a and 15b, and is supplied into the chamber 1 through the respective gas flow holes 16e and 16f to be diffused in a shower form.

A variable DC power supply 52 is electrically connected to the shower head 16 through a low pass filter (LPF) 51 and a switch 53. The switch 53 controls the supply or cut-off of a DC voltage from the variable DC power supply 52 to the shower head 16. For example, when a high frequency power is supplied from the high-frequency power sources 10a and 10b to the placing table 2 so that plasma is generated in the processing space S within the chamber 1, the switch 53 is turned on as necessary, and then a predetermined DC voltage is applied to the shower head 16 functioning as an upper electrode.

An exhaust path 71 is provided around the placing table 2 to surround the placing table 2. An exhaust pipe 72 is connected to the exhaust path 71, and an exhaust device 73 is connected to the exhaust pipe 72. The exhaust device 73 includes a vacuum pump such as, for example, a turbo molecular pump. When the vacuum pump is operated, the exhaust device 73 may depressurize the inside of the chamber 1 to a predetermined vacuum degree through the exhaust path 71.

Between the processing space S and the exhaust path 71, a baffle plate 18 which has a plurality of through holes is provided around the placing table 2 to surround the placing table 2. The baffle plate 18 is provided between an inner wall 77 closer to the placing table 2 and an inner wall 76 farther from the placing table 2 between inner walls of the exhaust path 71. In the present exemplary embodiment, the baffle plate 18 is provided at a position lower than the top surface of the electrostatic chuck 6 on which the semiconductor wafer W is placed. In the present exemplary embodiment, the baffle plate 18 is provided obliquely around the placing table 2 so that its position becomes higher as it gets farther from the placing table 2. The baffle plate 18 causes plasma generated within the processing space S to be confined within the processing space S, and passes the supplied processing gas within the processing space S into the exhaust path 71.

Within the exhaust path 71, a rectifying plate 19 is provided around the placing table 2 to surround the placing table 2 at a position farther from the processing space S than the baffle plate 18. The rectifying plate 19 is made of, for example, aluminum with an anodized surface. The rectifying plate 19 is arranged at a predetermined distance away from the baffle plate 18. In the present exemplary embodiment, a distance between the baffle plate 18 and the rectifying plate 19 is longer than the thickness of the rectifying plate 19. In the present exemplary embodiment, the rectifying plate 19 is provided on the inner wall 77 closer to the placing table 2, within the exhaust path 71. The rectifying plate 19 adjusts the exhaust amount of a processing gas flowing from the baffle plate 18 to the exhaust device 73 through the exhaust pipe 72, within the exhaust path 71, according to the distance from the exhaust device 73. That is, the rectifying plate 19 adjusts the exhaust amount of the processing gas flowing within the exhaust path 71 so that, around the placing table 2, the exhaust amount of the processing gas flowing to the exhaust device 73 from the baffle plate 18 is decreased at a position closer to the exhaust device 73, and the exhaust amount of the processing gas flowing to the exhaust device 73 from the baffle plate 18 is increased at a position farther from the exhaust device 73.

An opening 74 is provided in the side wall of the chamber 1, and a gate valve G is provided in the opening 74 to open and close the opening 74. A deposition shield is detachably provided on the inner wall of the chamber 1 and the outer peripheral surface of the placing table 2. The deposition shield prevents by-product of etching (deposition) from being deposited on the inner wall of the chamber 1. At the position of the deposition shield having substantially the same height as the semiconductor wafer W attracted to and held on the electrostatic chuck 6, a conductive member (GND block) 79 connected to a ground in a DC manner is provided. By the GND block 79, an abnormal discharge is suppressed within the chamber 1.

A ring magnet 80 is concentrically disposed around the chamber 1. The ring magnet 80 forms a magnetic field within the processing space S between the shower head 16 and the placing table 2. The ring magnet 80 is rotatably held by a rotation mechanism (not illustrated).

The operation of the plasma processing apparatus 10 configured as described above is generally controlled by a controller 60. The controller 60 includes a central processing unit (CPU), and also includes a process controller 61 that controls respective units of the plasma processing apparatus 10, a user interface 62, and a storage unit 63.

The user interface 62 includes, for example, a keyboard used when an operator inputs, for example, commands for operating the plasma processing apparatus 10, and a display for visually displaying the operation status of the plasma processing apparatus 10.

The storage unit 63 stores, therein, a control program (software) for realizing various processings performed in the plasma processing apparatus 10 by the control of the process controller 61, or a recipe in which, for example, processing condition data are recorded. The process controller 61 operates based on the control program stored within the storage unit 63, and reads, for example, a recipe from the storage unit 63 according to, for example, an instruction received through the user interface 62. Then, according to, for example, the recipe read by the process controller 61, the plasma processing apparatus 10 is controlled to perform a desired processing. The process controller 61 is capable of reading, for example, the control program or the recipe stored in, for example, a computer-readable recording medium (e.g., a hard disk, a CD, a flexible disk, or a semiconductor memory), from the recording medium, and executing the control program or the recipe. The process controller 61 is capable of acquiring, for example, the control program or the recipe stored in a storage unit of another device, from the device through, for example, a communication line, and executing the control program or the recipe.

In the plasma processing apparatus 10, when a plasma processing is performed on the semiconductor wafer W, the controller 60 performs the following control on the plasma processing apparatus 10. First, the controller 60 controls the valves V1 and V2, and the MFCs 15*c* and 15*d* in a state where the semiconductor wafer W is placed on the electrostatic chuck 6 to supply a processing gas at a predetermined flow rate into each of the gas diffusion chambers 16*c* and 16*d*. The processing gas supplied into the gas diffusion chambers 16*c* and 16*d* is supplied into the chamber 1 through the gas flow holes 16*e* and 16*f* to be diffused in a shower form. The controller 60 controls the exhaust amount of the exhaust device 73 so as to control the inside of the chamber 1 at a predetermined pressure.

Then, the controller 60 generates a predetermined high frequency power in each of the high-frequency power sources 10*a* and 10*b* and applies the generated power to the placing table 2, and controls the switch 53 to be turned on so that a predetermined DC voltage is applied to the shower head 16. Accordingly, plasma of the processing gas is generated in the processing space S between the semiconductor wafer W on the electrostatic chuck 6, and the shower head 16. Then, by ions or radicals included in the plasma generated in the processing space S, a predetermined processing such as, for example, etching or film forming is performed on the semiconductor wafer W on the electrostatic chuck 6.

Figure 2:
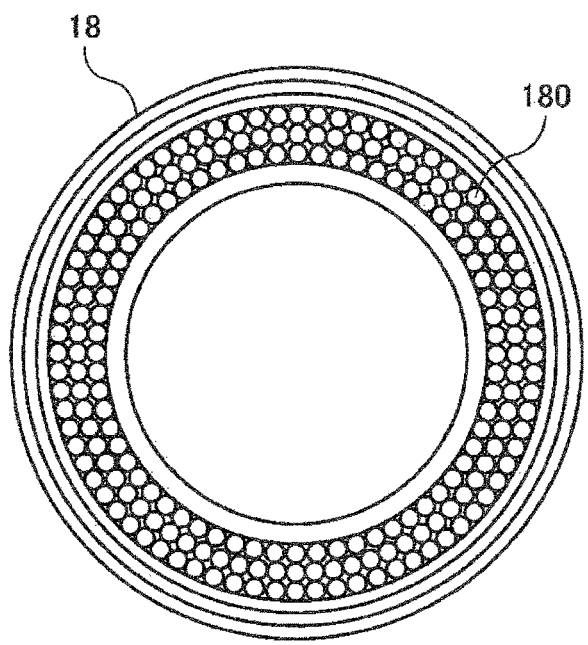
FIG. 2 is a plan view illustrating an example of a baffle plate.

FIG. 2 is a plan view illustrating an example of the baffle plate 18. For example, as illustrated in FIG. 2, the baffle plate 18 has an annular appearance when viewed from the top, that is, in a direction from the shower head 16 to the placing table 2. In the baffle plate 18, a plurality of through holes 180 are provided at substantially equal intervals within the plane of the baffle plate 18. In the present exemplary embodiment, the plurality of through holes 180 are concentrically arranged within the plane of the baffle plate 18. When the plurality of through holes 180 are provided within the plane of the baffle plate 18 at substantially equal intervals, the through holes 180 may be arranged in a radial or grid form as well as in the concentric arrangement. The opening of each of the through holes 180 is circular. Meanwhile, when the respective openings have the same shapes, the openings may have, for example, an oval shape, an elliptical shape, or a fan shape.

Figure 3:
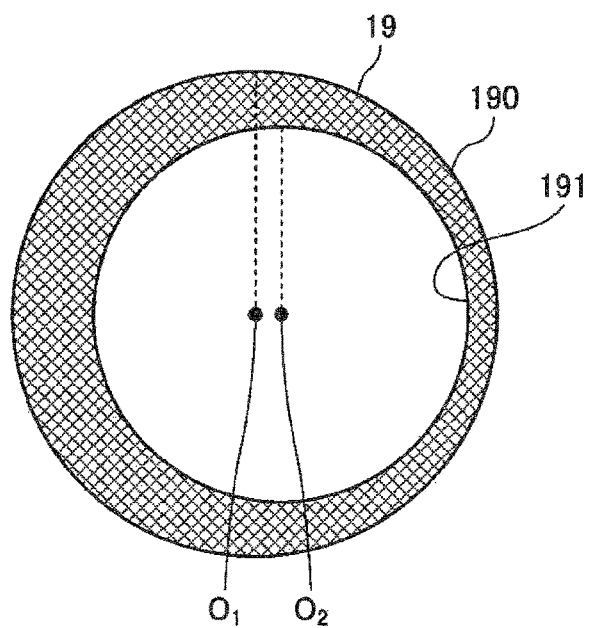
FIG. 3 is a plan view illustrating an example of a rectifying plate in Exemplary Embodiment 1.

FIG. 3 is a plan view illustrating an example of the rectifying plate 19. For example, as illustrated in FIG. 3, the rectifying plate 19 has an annular appearance when viewed from the top, that is, in a direction from the shower head 16 to the placing table 2. In the present exemplary embodiment, an outer peripheral surface 190 and an inner peripheral surface 191 of the rectifying plate 19 are formed in a substantially circular shape when viewed from the top. Meanwhile, the center $O_1$ of the circle formed by the outer peripheral surface 190 and the center $O_2$ of the circle formed by the inner peripheral surface 191 have different positions. That is, the circle formed by the outer peripheral surface 190 is eccentric with respect to the circle formed by the inner peripheral surface 191. Therefore, the rectifying plate 19 has a radial width varying according to the position in the circumferential direction when viewed from the top. The outer peripheral surface 190 and the inner peripheral surface 191 of the rectifying plate 19 may be formed into substantially an oval shape when viewed from the top.

Figure 4:
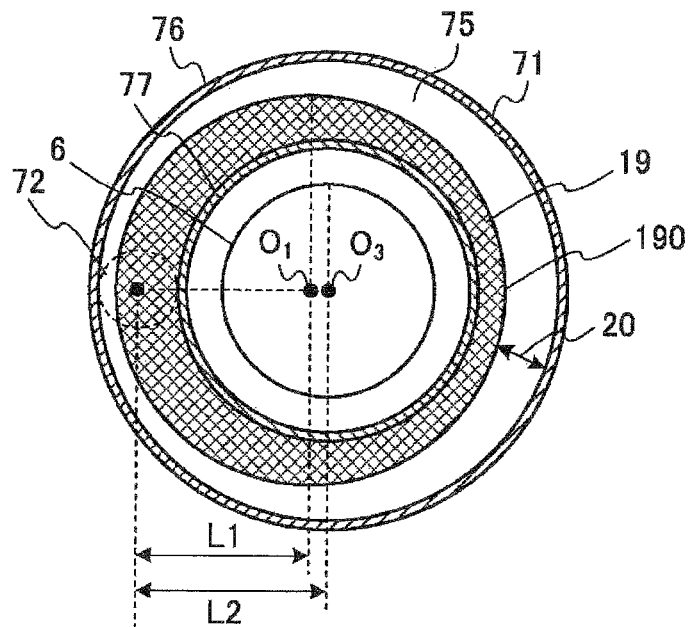
FIG. 4 is a view illustrating an example of a positional relationship between the rectifying plate and the top surface of an electrostatic chuck in Exemplary Embodiment 1.

FIG. 4 is a view illustrating an example of a positional relationship between the rectifying plate 19 and the top surface of the electrostatic chuck 6 in Exemplary Embodiment 1. When viewed in a direction from the shower head 16 toward the placing table 2, the radial width of the rectifying plate 19 is narrower than the width in the section of the flow path within the exhaust path 71. Thus, within the exhaust path 71, an opening 75 is formed by a gap 20 between the outer peripheral surface 190 of the rectifying plate 19 and the inner wall 76 within the exhaust path 71 farther from the placing table 2. In the present exemplary embodiment, the rectifying plate 19 forms a single opening 75 within the exhaust path 71.

Also, for example, as illustrated in FIG. 4, in a state where the rectifying plate 19 is provided within the exhaust path 71, the center of the inner peripheral surface 191 of the rectifying plate 19 is coincident with the center $O_3$ of the circle formed by the top surface of the electrostatic chuck 6. Meanwhile, the center $O_1$ of the outer peripheral surface 190 of the rectifying plate 19 is located at a side of the exhaust pipe 72 that connects the exhaust path 71 to the exhaust device 73, with respect to the center $O_3$ of the circle formed by the top surface of the electrostatic chuck 6. That is, a distance L1 from the exhaust pipe 72 to the center $O_1$ of the outer peripheral surface 190 is shorter than a distance L2 from the exhaust pipe 72 to the center $O_3$ of the circle formed by the top surface of the electrostatic chuck 6. Accordingly, the opening 75 formed between the outer peripheral surface 190 of the rectifying plate 19, and the inner wall 76 within the exhaust path 71 farther from the placing table 2 becomes narrower at a position closer to the exhaust pipe 72 in the circumferential direction, and becomes wider at a position farther from the exhaust pipe 72.

In the plasma processing apparatus 10 according to the present exemplary embodiment, the processing gas supplied into the processing space S flows into the exhaust path 71 through the plurality of through holes 180 formed in the baffle plate 18 by the operation of the exhaust device 73. Then, the processing gas that has passed through the baffle plate 18 flows into the exhaust pipe 72 through the opening 75 formed between the outer peripheral surface 190 of the rectifying plate 19 and the inner wall 76 within the exhaust path 71. The opening 75 formed between the rectifying plate 19, and the inner wall 76 within the exhaust path 71 becomes narrower at a position closer to the exhaust pipe 72, and becomes wider at a position farther from the exhaust pipe 72. Therefore, an increase of an exhaust amount within the flow path closer to the exhaust pipe 72 is suppressed, and a reduction of an exhaust amount within the flow path farther from the exhaust pipe 72 is suppressed. Accordingly, in the circumferential direction of the semiconductor wafer W, a deviation of the exhaust amount of the processing gas exhausted through the exhaust path 71 from the processing space S may be suppressed.

Here, an opening area of each of the through holes 180 formed in the baffle plate 18 is formed to be wider as much as possible as long as plasma can be confined within the processing space S. Accordingly, the reduction of the exhaust conductance by the baffle plate 18 is suppressed. Therefore, under any optional pressure processing condition, the pressure within the processing space S may be controlled at a predetermined pressure.

Since the baffle plate 18 and the rectifying plate 19 are spaced apart from each other by a predetermined distance, the processing gas exhausted into the exhaust path 71 through the respective through holes 180 of the baffle plate 18 is smoothly flowed into the opening 75 formed between the rectifying plate 19 and the inner wall 76 within the exhaust path 71, through the inside of the exhaust path 71. The rectifying plate 19 smoothly changes the flow path without interrupting the flow of the processing gas that is exhausted into the exhaust path 71 through the respective through holes 180 of the baffle plate 18. Accordingly, the reduction of an exhaust conductance within the exhaust path 71 between the baffle plate 18 and the rectifying plate 19 is suppressed, and the increase of a pressure within the exhaust path 71 is suppressed.

As described above, in the plasma processing apparatus 10 according to the present exemplary embodiment, the baffle plate 18 and the rectifying plate 19 are provided within the exhaust path 71, and the flow of the exhausted processing gas is gradually rectified in two stages. Accordingly, the reduction of the exhaust conductance within the exhaust path 71 is suppressed, and the deviation of an exhaust amount of the processing gas around the placing table 2 is suppressed. Accordingly, in the processing space S above the semiconductor wafer W, the deviation in a pressure or a flow velocity of the processing gas in the circumferential direction of the semiconductor wafer W may be suppressed. Accordingly, in the processing space S above the semiconductor wafer W, the deviation in a density of the processing gas in the circumferential direction of the semiconductor wafer W may be suppressed, thereby suppressing non-uniformity of a property such as a CD deviation in the processed semiconductor wafer W.

[Simulation Result]

Figure 5:
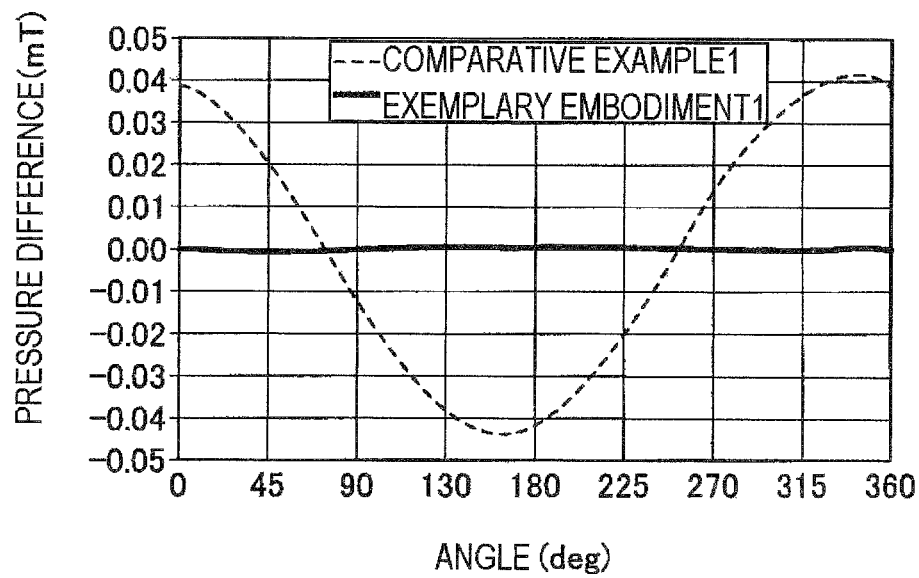
FIG. 5 is a view illustrating an example of a simulation result of a pressure distribution within a chamber in a circumferential direction of a semiconductor wafer.

FIG. 5 is a view illustrating an example of a simulation result of a pressure distribution within the chamber 1 in the circumferential direction of the semiconductor wafer W. The horizontal axis in FIG. 5 indicates a circumferential angle relative to a predetermined position on the semiconductor wafer W. The vertical axis in FIG. 5 indicates a pressure difference between a pressure within the chamber 1 in the circumferential direction of the semiconductor wafer W and an average pressure within the chamber 1 in the circumferential direction of the semiconductor wafer W. FIG. 5 illustrates a pressure within the processing space S on the circumference at a distance of 150 mm from the center of the semiconductor wafer W. Comparative Example 1 illustrated in FIG. 5 corresponds to a simulation result on a plasma processing apparatus 10 in which only the baffle plate 18 is provided within the exhaust path 71, and the rectifying plate 19 is not provided within the exhaust path 71.

As clearly found from the simulation result in FIG. 5, in the plasma processing apparatus 10 according to Comparative Example 1, a difference between maximum and minimum values of a pressure difference within the chamber 1 in the circumferential direction of the semiconductor wafer W is about 0.08 mT. In contrast, in the plasma processing apparatus 10 according to Exemplary Embodiment 1 in which the baffle plate 18 and the rectifying plate 19 are provided within the exhaust path 71, a difference between maximum and minimum values of a pressure difference within the chamber 1 in the circumferential direction of the semiconductor wafer W is less than about 0.01 mT. As clearly found from the simulation result in FIG. 5, in the plasma processing apparatus 10 according to the present exemplary embodiment, since the baffle plate 18 and the rectifying plate 19 are provided within the exhaust path 71, a deviation of a pressure distribution within the chamber 1 is suppressed in the circumferential direction of the semiconductor wafer W.

Figure 6A:
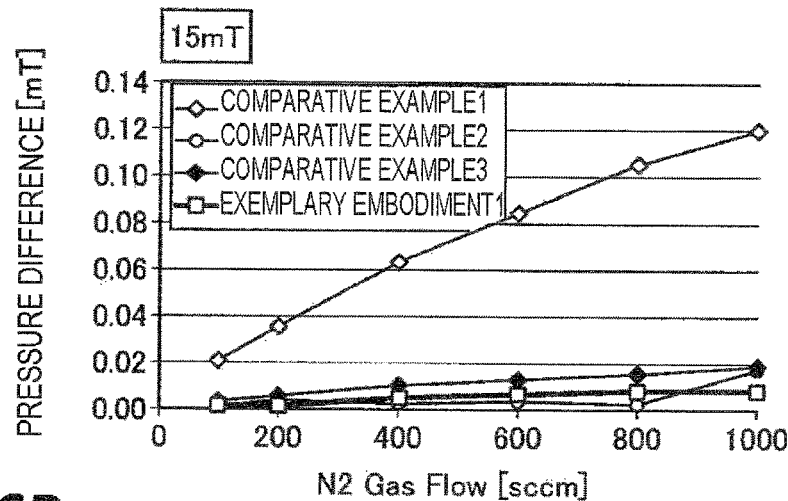
FIGS. 6A to 6C are views each illustrating an example of a simulation result of a pressure distribution within a chamber in a circumferential direction of a semiconductor wafer when a processing condition is changed.
Figure 6B:
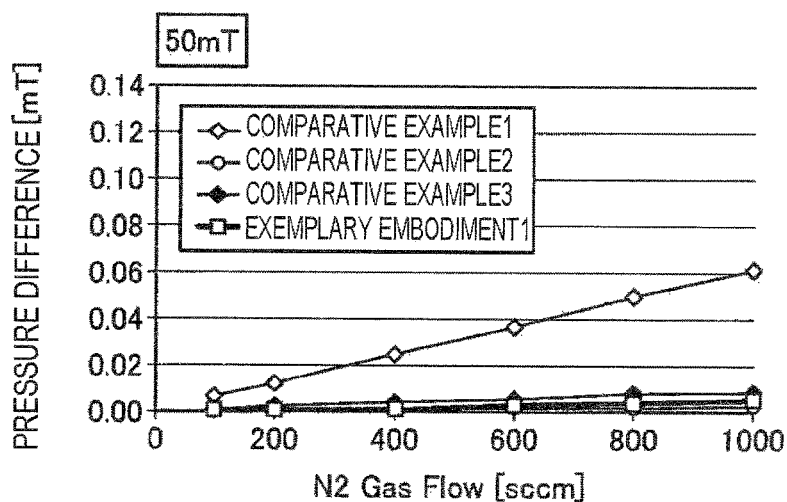
Figure 6C:
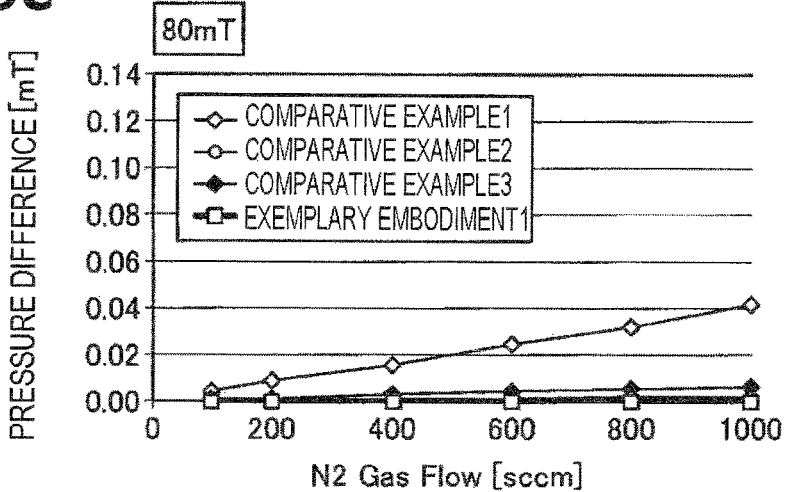
Figure 7A:
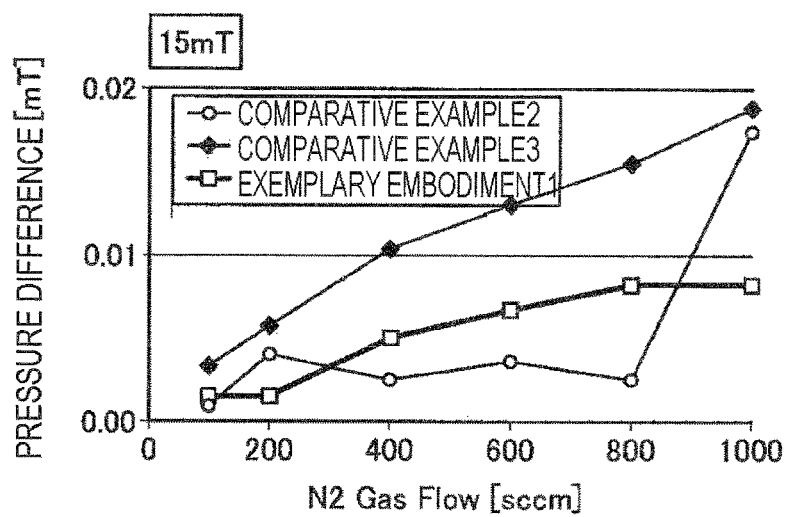
FIGS. 7A to 7C are views illustrating FIGS. 6A to 6C in an enlarged scale.
Figure 7B:
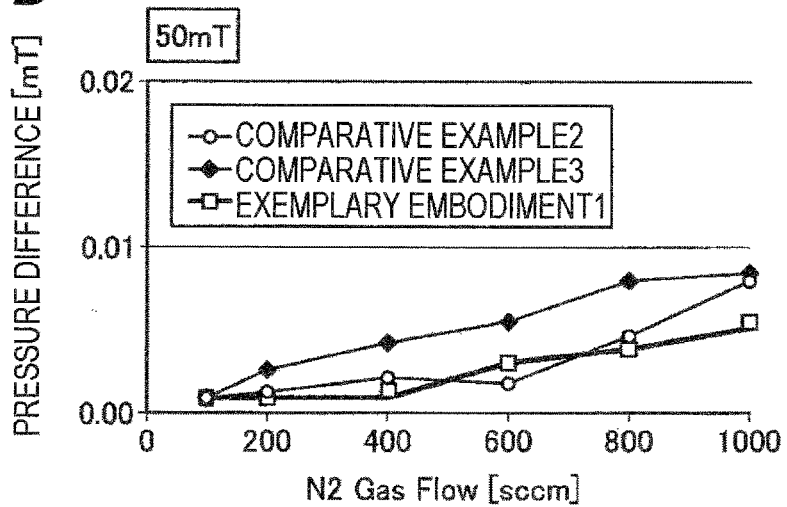
Figure 7C:
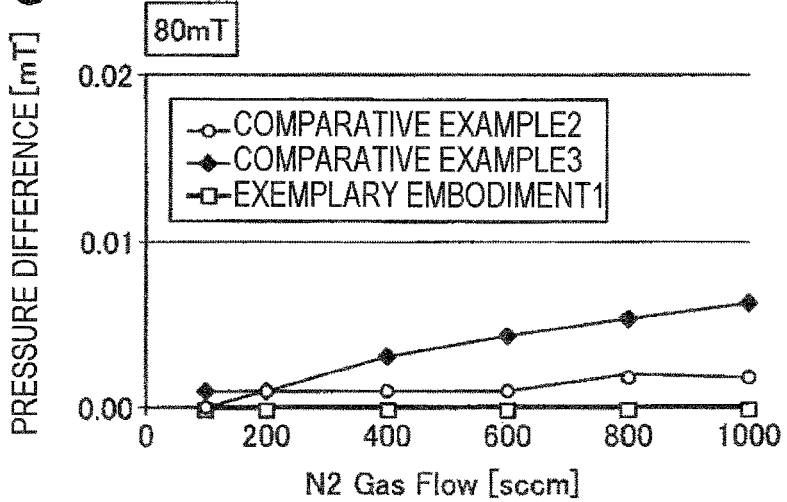

FIGS. 6A to 6C and FIGS. 7A to 7C are views each illustrating an example of a simulation result of a pressure distribution within the chamber 1 in a circumferential direction of the semiconductor wafer W when a processing condition is changed. FIGS. 7A to 7C are views corresponding to FIGS. 6A to 6C, respectively, in an enlarged scale in a pressure difference range of 0 mT to 0.02 mT. As processing conditions to be varied, a pressure within the chamber 1 and a flow rate of the processing gas to be supplied into the chamber 1 were used. As the processing gas, $N_2$ gas was used. The horizontal axis in each of FIGS. 6A to 6C and FIGS. 7A to 7C indicates a flow rate of the processing gas ($N_2$ gas). The vertical axis in each of FIGS. 6A to 6C and FIGS. 7A to 7C indicates a difference between maximum and minimum values of a pressure within the chamber 1 in the circumferential direction of the semiconductor wafer W.

FIGS. 6A and 7A illustrate a pressure difference in the circumferential direction of the semiconductor wafer W when the pressure within the chamber 1 is controlled to 15 mT, and the flow rate of the processing gas is changed. FIGS. 6B and 7B illustrate a pressure difference in the circumferential direction of the semiconductor wafer W when the pressure within the chamber 1 is controlled to 50 mT, and the flow rate of the processing gas is changed. FIGS. 6C and 7C illustrate a pressure difference in the circumferential direction of the semiconductor wafer W when the pressure within the chamber 1 is controlled to 80 mT, and the flow rate of the processing gas is changed.

Here, Comparative Example 2 illustrated in FIGS. 6A to 6C and FIGS. 7A to 7C corresponds to a simulation result on the plasma processing apparatus 10 in which only the baffle plate 18 is provided within the exhaust path 71, and the rectifying plate 19 is not provided within the exhaust path 71. Meanwhile, the opening area of through holes of the baffle plate 18 provided in the plasma processing apparatus 10 according to Comparative Example 2 is smaller than the opening area of the through holes 180 within the baffle plate 18 provided in the plasma processing apparatus 10 according to Exemplary Embodiment 1. In the plasma processing apparatus 10 according to Comparative Example 2, the opening area of the through holes of the baffle plate 18 is reduced, and thus, the exhaust conductance is lowered when the processing gas is exhausted through the baffle plate 18. Therefore, the flow velocity of the processing gas exhausted through the baffle plate 18 becomes generally small, and thus the processing gas is stayed within the processing space S. Accordingly, within the processing space S, a deviation of the pressure distribution within the chamber 1 is suppressed in the circumferential direction of the semiconductor wafer W.

Comparative Example 3 illustrated in FIGS. 6A to 6C and FIGS. 7A to 7C corresponds to a simulation result on the plasma processing apparatus 10 in which only the baffle plate 18 is provided within the exhaust path 71, and the rectifying plate 19 is not provided within the exhaust path 71. Meanwhile, the plurality of through holes of the baffle plate 18 provided in the plasma processing apparatus 10 according to Comparative Example 3 are arranged such that the density becomes lower at a position closer to the exhaust pipe 72 connected to the exhaust device 73, and the density becomes higher at a position farther from the exhaust pipe 72. Accordingly, in the plasma processing apparatus 10 according to Comparative Example 3, in the circumferential direction of the semiconductor wafer W, the exhaust conductance becomes lower at a position closer to the exhaust pipe 72 connected to the exhaust device 73, and the exhaust conductance becomes higher at a position farther from the exhaust pipe 72. Thus, in the circumferential direction of the semiconductor wafer W, a deviation of the flow velocity of the processing gas exhausted through the baffle plate 18 is suppressed. Accordingly, within the processing space S, a deviation of the pressure distribution within the chamber 1 is suppressed in the circumferential direction of the semiconductor wafer W.

Referring to the simulation results of FIGS. 6A to 6C, in the plasma processing apparatus 10 according to Comparative Example 1, a pressure difference within the chamber 1 in the circumferential direction of the semiconductor wafer W is large as compared to that in the plasma processing apparatus 10 according to Exemplary Embodiment 1. In the plasma processing apparatus 10 according to Comparative Example 1, a variation of a pressure difference within the chamber 1 in the circumferential direction of the semiconductor wafer W is large with respect to a change of the pressure within the chamber 1 and the flow rate of the processing gas, as compared to that in the plasma processing apparatus 10 according to Exemplary Embodiment 1. When the variation of the pressure difference in the circumferential direction of the semiconductor wafer W is large with respect to the change of the processing conditions, processing conditions capable of suppressing a pressure difference to a predetermined range in the circumferential direction of the semiconductor wafer W are limited.

Referring to the simulation results of FIGS. 6A to 6C and FIGS. 7A to 7C, in the plasma processing apparatus 10 according to Comparative Example 2, a pressure difference within the chamber 1 in the circumferential direction of the semiconductor wafer W may be small as compared to that in the plasma processing apparatus 10 according to Exemplary Embodiment 1. However, in the plasma processing apparatus 10 according to Comparative Example 2, a variation of a pressure difference within the chamber 1 in the circumferential direction of the semiconductor wafer W is large with respect to a change of the pressure within the chamber 1 and the flow rate of the processing gas, as compared to that in the plasma processing apparatus 10 according to Exemplary Embodiment 1. In Comparative Example 2 as well, since the variation of the pressure difference in the circumferential direction of the semiconductor wafer W is large with respect to the change of the processing conditions, processing conditions capable of suppressing a pressure difference to a predetermined range in the circumferential direction of the semiconductor wafer W are limited.

Referring to the simulation results of FIGS. 6A to 6C and FIGS. 7A to 7C, in the plasma processing apparatus 10 according to Comparative Example 3, a pressure difference within the chamber 1 in the circumferential direction of the semiconductor wafer W is generally large as compared to that in the plasma processing apparatus 10 according to Exemplary Embodiment 1. In the plasma processing apparatus 10 according to Comparative Example 3, a variation of a pressure difference within the chamber 1 in the circumferential direction of the semiconductor wafer W is also large with respect to a change of the pressure within the chamber 1 and the flow rate of the processing gas, as compared to that in the plasma processing apparatus 10 according to Exemplary Embodiment 1. In Comparative Example 3 as well, since the variation of the pressure difference in the circumferential direction of the semiconductor wafer W is large with respect to the change of the processing conditions, processing conditions capable of suppressing a pressure difference to a predetermined range in the circumferential direction of the semiconductor wafer W are limited.

Referring to the simulation results of FIGS. 6A to 6C and FIGS. 7A to 7C, in the plasma processing apparatus 10 according to Exemplary Embodiment 1, a pressure difference within the chamber 1 in the circumferential direction of the semiconductor wafer W is small as compared to that in the plasma processing apparatus 10 according to Comparative Examples 1 to 3. In the plasma processing apparatus 10 according to Exemplary Embodiment 1, a variation of a pressure difference within the chamber 1 in the circumferential direction of the semiconductor wafer W is small with respect to a change of the pressure within the chamber 1 and the flow rate of the processing gas, as compared to that in the plasma processing apparatus 10 according to Comparative Examples 1 to 3. In the plasma processing apparatus 10 according to Exemplary Embodiment 1, since the variation of the pressure difference in the circumferential direction of the semiconductor wafer W is small with respect to the change of the processing conditions as compared to that in the plasma processing apparatus 10 according to Comparative Examples 1 to 3, it is possible to suppress the pressure difference to a predetermined range in the circumferential direction of the semiconductor wafer W under the wider optional processing conditions.

Referring to the simulation results of FIGS. 6A to 6C and FIGS. 7A to 7C, in Comparative Examples 1 to 3 and Exemplary Embodiment 1, as the pressure within the chamber 1 is lower, a variation of the pressure difference in the circumferential direction of the semiconductor wafer W becomes large with respect to the change of the processing conditions. Thus, when a processing is performed on the semiconductor wafer W under a processing condition of a lower pressure, the variation of the pressure difference in the circumferential direction of the semiconductor wafer W is further increased with respect to the change of the processing conditions such as a flow rate of the processing gas.

Figure 8A:
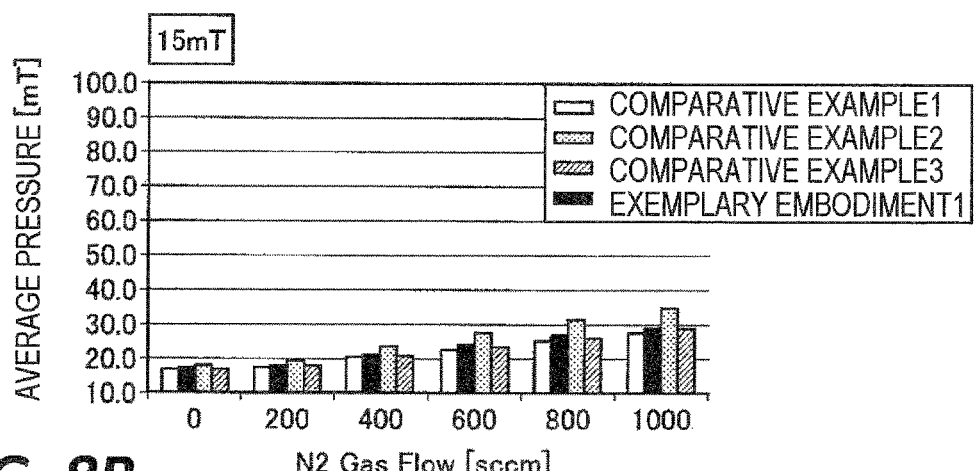
FIGS. 8A to 8C are views each illustrating an example of an average pressure within a chamber when a processing condition is changed.
Figure 8B:
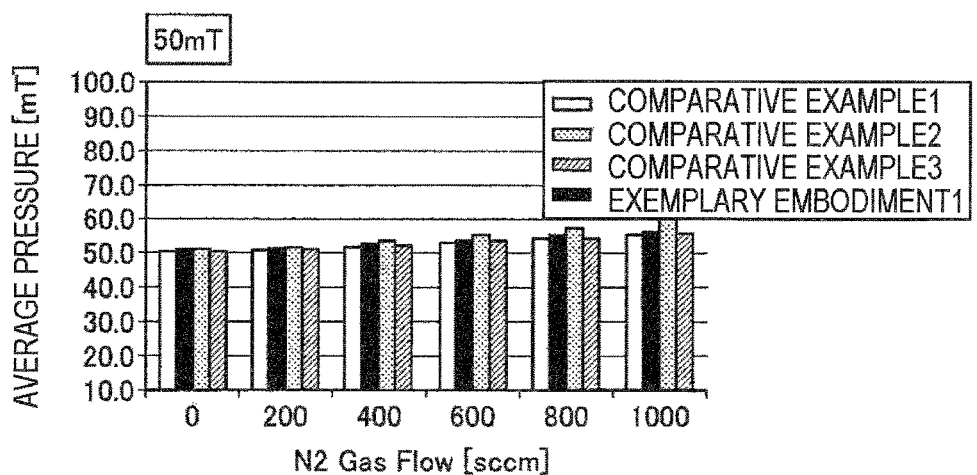
Figure 8C:
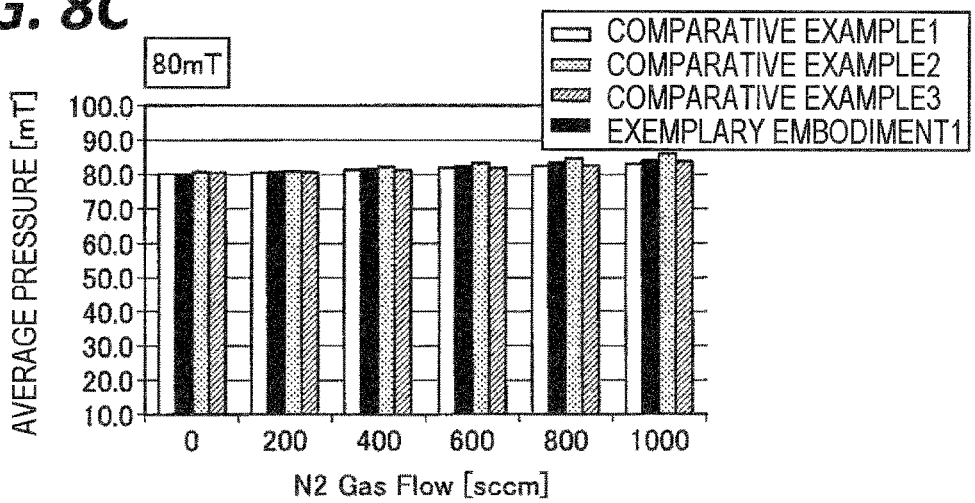

FIGS. 8A to 8C are views each illustrating an example of a simulation result of an average pressure within the chamber 1 when a processing condition is changed. As processing conditions to be varied, the pressure within the chamber 1 and the flow rate of the processing gas ($N_2$ gas) were used as in FIGS. 6A to 6C and FIGS. 7A to 7C. The horizontal axis in FIGS. 8A to 8C indicates a flow rate of the processing gas ($N_2$ gas). The vertical axis in FIGS. 8A to 8C indicates an average pressure within the chamber 1.

Referring to the simulation results of FIGS. 8A to 8C, in Comparative Example 2, the average pressure within the chamber 1 is generally large as compared to that in Comparative Examples 1 and 3, and Exemplary Embodiment 1. In the plasma processing apparatus 10 according to Comparative Example 2, the opening area of the through holes 180 of the baffle plate 18 is small so that the exhaust conductance of the baffle plate 18 is reduced. Thus, the average pressure within the chamber 1 is increased. When the miniaturization of the processing of the semiconductor wafer W proceeds, a plasma processing is performed on the semiconductor wafer W under a processing condition of a lower pressure. However, in the plasma processing apparatus 10 according to Comparative Example 2, a deviation of the pressure distribution within the chamber 1 in the circumferential direction of the semiconductor wafer W is suppressed while the pressure within the chamber 1 is increased. Thus, it becomes difficult to control the inside of the chamber 1 at a low pressure.

In contrast, in the plasma processing apparatus 10 according to Exemplary Embodiment 1, as clearly found from the simulation results of FIGS. 8A to 8C, an increase of the average pressure within the chamber 1 is suppressed. Thus, in the plasma processing apparatus 10 according to Exemplary Embodiment 1, it becomes possible to control the pressure within the chamber 1 within a predetermined pressure under a processing condition of a lower pressure.

As described above, the plasma processing apparatus 10 in Exemplary Embodiment 1 has been described. As clearly found from the above description, according to the plasma processing apparatus 10 in Exemplary Embodiment 1, under the optional processing conditions, the deviation in the pressure and flow velocity of the processing gas in the circumferential direction of the semiconductor wafer W may be suppressed.

Exemplary Embodiment 2

A plasma processing apparatus 10 of Exemplary Embodiment 2 is different from the plasma processing apparatus 10 of Exemplary Embodiment 1 in that while the plasma processing apparatus 10 of Exemplary Embodiment 1 is provided with the rectifying plate 19 on the inner wall 77 of the exhaust path 71 closer to the placing table 2, the plasma processing apparatus 10 of Exemplary Embodiment 2 is provided with the rectifying plate 19 on the inner wall 76 of the exhaust path 71 farther from the placing table 2. Hereinafter, the plasma processing apparatus 10 of Exemplary Embodiment 2 will be described. The plasma processing apparatus 10 of Exemplary Embodiment 2 is the same as the plasma processing apparatus 10 of Exemplary Embodiment 1 described using FIG. 1, except for the mounting position of the rectifying plate 19 within the exhaust path 71, and thus duplicate explanations will be omitted.

Figure 9:
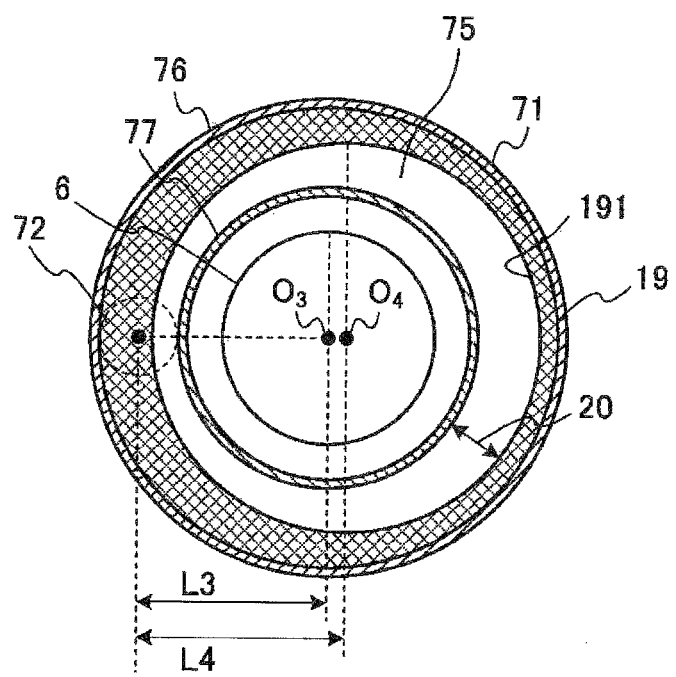
FIG. 9 is a view illustrating an example of a positional relationship between a rectifying plate and the top surface of an electrostatic chuck in Exemplary Embodiment 2.

FIG. 9 is a view illustrating an example of a positional relationship between the rectifying plate 19 and the top surface of the electrostatic chuck 6 in Exemplary Embodiment 2. For example, as illustrated in FIG. 9, the rectifying plate 19 according to the present exemplary embodiment is provided on the inner wall 76 within the exhaust path 71 farther from the placing table 2. When viewed from the top, the radial width of the rectifying plate 19 is narrower than the width in the section of the flow path within the exhaust path 71. Thus, within the exhaust path 71, an opening 75 is formed by a gap 20 between the inner peripheral surface 191 of the rectifying plate 19, and the inner wall 77 within the exhaust path 71 closer to the placing table 2.

In a state where the rectifying plate 19 is provided within the exhaust path 71, the center of the outer peripheral surface 190 of the rectifying plate 19 is coincident with the center $O_3$ of the circle formed by the top surface of the electrostatic chuck 6. Meanwhile, the center $O_4$ of the inner peripheral surface 191 of the rectifying plate 19 is located farther from the exhaust pipe 72 than the center $O_3$ of the circle formed by the top surface of the electrostatic chuck 6. That is, a distance L3 from the exhaust pipe 72 to the center $O_3$ of the circle formed by the top surface of the electrostatic chuck 6 is shorter than a distance L4 from the exhaust pipe 72 to the center $O_4$ of the inner peripheral surface 191. Accordingly, the opening 75 formed between the inner peripheral surface 191 of the rectifying plate 19 and the inner wall 77 within the exhaust path 71 closer to the placing table 2 becomes narrower at a position closer to the exhaust pipe 72 in the circumferential direction, and becomes wider at a position farther from the exhaust pipe 72.

In the rectifying plate 19 according the present exemplary embodiment as well, the exhaust amount of the processing gas flowing within the exhaust path 71 is adjusted such that around the placing table 2, the exhaust amount of the processing gas flowing into the exhaust pipe 72 from the baffle plate 18 is decreased at a position closer to the exhaust pipe 72, and the exhaust amount of the processing gas flowing into the exhaust pipe 72 from the baffle plate 18 is increased at a position farther from the exhaust pipe 72. Accordingly, in the circumferential direction of the semiconductor wafer W, a deviation of the exhaust amount of the processing gas exhausted through the exhaust path 71 from the processing space S may be suppressed.

In the plasma processing apparatus 10 according to the present exemplary embodiment as well, the baffle plate 18 and the rectifying plate 19 are provided within the flow path within the exhaust path 71, and the exhausted processing gas is gradually rectified in two stages. Accordingly, a reduction of the exhaust conductance within the exhaust path 71 is suppressed, and a deviation of an exhaust amount of the processing gas around the placing table 2 is suppressed.

[Others]

In Exemplary Embodiments 1 and 2 described above, the baffle plate 18 is provided obliquely around the placing table 2 so that its position becomes higher as it gets farther from the placing table 2. However, the disclosure is not limited thereto. For example, the baffle plate 18 may be provided substantially horizontally around the placing table 2, or may be provided obliquely around the placing table 2 so that its position becomes lower as it gets farther from the placing table 2. It is desirable that a distance between the baffle plate 18 and the rectifying plate 19 is longer as an angle between the baffle plate 18 and the horizontal surface becomes smaller, and the distance is shorter as an angle between the baffle plate 18 and the horizontal surface becomes larger. Meanwhile, in either case, a distance between the baffle plate 18 and the rectifying plate 19 is longer than the thickness of the rectifying plate 19.

In the above described exemplary embodiments, the plasma processing apparatus 10 that performs etching on the semiconductor wafer W using plasma has been described as an example. However, the disclosure is not limited thereto. The technology described in the exemplary embodiments may also be applied to, for example, a film forming apparatus that forms a predetermined film on the semiconductor wafer W, or a reforming apparatus that exposes the semiconductor wafer W to plasma to reforms the property of the film formed on the semiconductor wafer W as long as such an apparatus includes the baffle plate 18 and the rectifying plate 19 provided within the exhaust path 71, and is configured to perform a processing on the semiconductor wafer W using plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber that is air-tightly configured such that a predetermined processing is performed on a substrate to be processed carried into the chamber by plasma generated within the chamber;
   a placing table provided within the chamber and configured to place the substrate thereon;
   an exhaust path provided around the placing table to surround the placing table, and configured to exhaust a gas within a processing space above the substrate placed on the placing table;
   an exhaust pipe attached to the chamber and connecting an exhaust device to the exhaust path, the exhaust device being configured to exhaust the gas within the processing space through the exhaust pipe, and wherein the exhaust pipe includes an upwardly facing opening;
   a baffle plate having a plurality of through holes and provided between the processing space and the exhaust path to surround the placing table; and
   a rectifying plate provided around the placing table to surround the placing table within the exhaust path at a position farther from the processing space than the baffle plate,
   wherein the rectifying plate forms an opening within the exhaust path around the placing table, the opening has a sectional area of a flow path within the exhaust path which is larger at a position farther from a position within the exhaust path connected to the exhaust pipe, and the sectional area of the opening is smaller at a position adjacent to a position within the exhaust path connected to the exhaust pipe such that the upwardly facing opening of the exhaust pipe only faces the smaller sectional area.

2. The plasma processing apparatus of claim 1, wherein the rectifying plate is provided on an inner wall of the exhaust path closer to the placing table between inner walls of the exhaust path provided around the placing table, and the opening is formed by a gap between an outer peripheral surface of the rectifying plate and an inner wall of the exhaust path farther from the placing table.

3. A plasma processing apparatus comprising:
   a chamber that is air-tightly configured such that a predetermined processing is performed on a substrate to be processed carried into the chamber by plasma generated within the chamber;
   a placing table provided within the chamber and configured to place the substrate thereon;
   an exhaust path provided around the placing table to surround the placing table, and configured to exhaust a gas within a processing space above the substrate placed on the placing table;
   an exhaust pipe attached to the chamber and connecting an exhaust device to the exhaust path;
   a baffle plate having a plurality of through holes and provided between the processing space and the exhaust path to surround the placing table; and
   a rectifying plate having an annular shape when viewed from a top side and provided around the placing table to surround the placing table within the exhaust path at a position farther from the processing space than the baffle plate, the rectifying plate being positioned between inner walls of the exhaust path,
   wherein the rectifying plate has an inner peripheral surface in contact with an inner wall of the exhaust path closer to the placing table and forms an opening by a gap between an outer peripheral surface of the rectifying plate and an inner wall of the exhaust path farther from the placing table within the exhaust path around the placing table to make a sectional area of a flow path within the exhaust path larger at a position farther from a position within the exhaust path connected to the exhaust pipe, a center of the outer peripheral surface is located closer to the exhaust pipe than a center of a placing surface of the placing table on which the substrate is placed, and the exhaust device is configured to exhaust the gas from the processing space through the exhaust path, past the rectifying plate, and vertically through the exhaust pipe.

4. The plasma processing apparatus of claim 1, wherein the rectifying plate is provided on an inner wall of the exhaust path farther from the placing table between inner walls of the exhaust path provided around the placing table, and the opening is formed by a gap between an inner peripheral surface of the rectifying plate and an inner wall of the exhaust path closer to the placing table.

5. The plasma processing apparatus of claim 4, wherein the rectifying plate has an annular shape when viewed from a top side, an outer peripheral surface of the rectifying plate is in contact with the inner wall of the exhaust path, and a center of the inner peripheral surface is located farther from the exhaust pipe than a center of a placing surface of the placing table on which the substrate is placed.

6. The plasma processing apparatus of claim 1, wherein the baffle plate is provided at a position lower than a placing surface of the placing table on which the substrate is placed.

7. The plasma processing apparatus of claim 1, wherein a distance between the baffle plate and the rectifying plate is longer than a thickness of the rectifying plate.

8. The plasma processing apparatus of claim 1, wherein the baffle plate is provided obliquely around the placing table so that a position of the baffle plate becomes higher at positions farther from the placing table.

9. The plasma processing apparatus of claim 1, wherein the plurality of through holes are provided within a plane of the baffle plate at substantially equal intervals.

10. The plasma processing apparatus of claim 1, wherein the rectifying plate forms the opening as a single opening within the exhaust path.

11. The plasma processing apparatus of claim 1, wherein the exhaust pipe extends in a vertical direction.

12. The plasma processing apparatus of claim 1, wherein the exhaust pipe is connected to the chamber at a bottom side of the chamber and extends through at least a portion of the chamber.

13. The plasma processing apparatus of claim 1, wherein the exhaust pipe is integrally formed with at least one of a portion of an inner wall of the placing table and an inner wall of the chamber.

14. The plasma processing apparatus of claim 1, wherein the exhaust gas is rectified in a first stage via the baffle plate and a second stage via the rectifying plate.

15. The plasma processing apparatus of claim 1, wherein the plurality of through holes are concentrically arranged within a plane of the baffle plate.

16. The plasma processing apparatus of claim 1, wherein the plurality of through holes are arranged in a radial or grid arrangement within a plane of the baffle plate.

17. The plasma processing apparatus of claim 1, wherein a shape of each of the plurality of through holes is a circle, an oval, an ellipse, or a fan.

18. The plasma processing apparatus of claim 1, wherein the upwardly facing opening of the exhaust pipe is positioned below the smaller sectional area of the opening of the rectifying plate, and wherein a radial dimension of the smaller sectional area is smaller than a width of the upwardly facing opening of the exhaust pipe.

19. The plasma processing apparatus of claim 18, wherein the smaller sectional area of the opening of the rectifying plate partially overlaps the upwardly facing opening of the exhaust pipe from a top view.

20. A plasma processing apparatus comprising:
a chamber that is air-tightly configured such that a predetermined processing is performed on a substrate to be processed carried into the chamber by plasma generated within the chamber;
a placing table provided within the chamber and configured to place the substrate thereon;
an exhaust path provided around the placing table to surround the placing table, and configured to exhaust a gas within a processing space above the substrate placed on the placing table;
an exhaust pipe attached to the chamber and connecting an exhaust device to the exhaust path, the exhaust device being configured to exhaust the gas within the processing space through the exhaust pipe;
a baffle plate having a plurality of through holes and provided between the processing space and the exhaust path to surround the placing table, the plurality of through holes being provided within a plane of the baffle plate at substantially equal intervals; and
a rectifying plate having an annular shape when viewed from a top side and provided around the placing table to surround the placing table within the exhaust path at a position farther from the processing space than the baffle plate and positioned between inner walls of the exhaust path,
wherein the rectifying plate is provided on the inner wall of the exhaust path farther from the placing table and forms a single opening by a gap between an inner peripheral surface of the rectifying plate and an inner wall of the exhaust path closer to the placing table to make a sectional area of a flow path within the exhaust path larger at a position farther from a position within the exhaust path connected to the exhaust pipe and smaller at a position adjacent to a position within the exhaust path connected to the exhaust pipe such that an upwardly facing opening of the exhaust pipe only faces the smaller sectional area, an outer peripheral surface of the rectifying plate is in contact with the inner wall of the exhaust path farther from the placing table, and a center of the inner peripheral surface is located farther from the exhaust pipe than a center of a placing surface of the placing table on which the substrate is placed, and
wherein the baffle plate is provided at a position lower than the placing surface of the placing table on which the substrate is placed and is provided obliquely around the placing table so that a position of the baffle plate becomes higher as the baffle place extends farther from the placing table, a distance between the baffle plate and the rectifying plate is longer than a thickness of the rectifying plate.

* * * * *